US011693151B2

(12) United States Patent
Sung et al.

(10) Patent No.: US 11,693,151 B2
(45) Date of Patent: Jul. 4, 2023

(54) METHOD AND APPARATUS FOR PRODUCING GROUND VEGETATION INPUT DATA FOR GLOBAL CLIMATE CHANGE PREDICTION MODEL

(71) Applicant: National Institute of Meteorological Sciences, Seogwipo-si (KR)

(72) Inventors: Hyun Min Sung, Seogwipo-si (KR); Kyung On Boo, Seogwipo-si (KR); Young Hwa Byun, Seogwipo-si (KR)

(73) Assignee: NATIONAL INSTITUTE OF METEOROLOGICAL SCIENCES, Seogwipo-si (KR)

( * ) Notice: Subject to any disclaimer, the term of this patent is extended or adjusted under 35 U.S.C. 154(b) by 68 days.

(21) Appl. No.: 17/476,735

(22) Filed: Sep. 16, 2021

(65) Prior Publication Data

US 2022/0179123 A1  Jun. 9, 2022

(30) Foreign Application Priority Data

Dec. 4, 2020  (KR) .......................... 10-2020-0168235

(51) Int. Cl.
*G01W 1/10* (2006.01)
*G06F 30/20* (2020.01)
(Continued)

(52) U.S. Cl.
CPC ................ *G01W 1/10* (2013.01); *G01W 1/18* (2013.01); *G01W 2201/00* (2013.01);
(Continued)

(58) Field of Classification Search
CPC ..... G01W 1/10; G01W 2201/00; G01W 1/18; G06F 30/20; G06F 16/55; G06F 16/583; G06F 16/587; G06F 2219/10; G06Q 10/04
See application file for complete search history.

(56) References Cited

U.S. PATENT DOCUMENTS

2020/0125822 A1 * 4/2020 Yang ...................... G06N 3/044

FOREIGN PATENT DOCUMENTS

JP    2008282075 A  * 11/2008
WO   WO-2013141252 A1 *  9/2013  ....... G06F 17/30091

OTHER PUBLICATIONS

Hurtt et al. (Harmonization of global land use change and management for the period 850-2100 (LUH2) for CMIPP6, Geosci. Model Dev., 13, 5425-5464, https://doi.org/10.5194/gmd-13-5425-2020, Nov. 10, 2020.) (Year: 2020).*

(Continued)

*Primary Examiner* — Daniel R Miller
*Assistant Examiner* — Christian T Bryant
(74) *Attorney, Agent, or Firm* — Knobbe, Martens, Olson & Bear, LLP

(57) ABSTRACT

This application relates to an input data generating apparatus for generating forcing data used as input data for a climate change prediction model. In one aspect, the apparatus includes a memory storing instructions and a processor configured to, by executing the instructions, collect new ground type data from land-use harmonization (LUH) data that is restored through history database of the global environment (HYDE) and provided by the coupled model inter-comparison project (CMIP). The processor may also collect existing ground type data calculated by an existing model in a previous phase of the CMIP, generate aggregated ground type data by data-aggregating the new ground type data and the existing ground type data, with priority to the new ground type data. The processor may further generate the forcing data from the aggregated ground type data by performing a distortion correction on a data distortion that occurs during the data aggregation.

6 Claims, 4 Drawing Sheets

(51) Int. Cl.
*G01W 1/18* (2006.01)
*G06F 16/587* (2019.01)
*G06F 16/55* (2019.01)
*G06F 16/583* (2019.01)
*G06Q 10/04* (2023.01)

(52) U.S. Cl.
CPC ............ *G06F 16/55* (2019.01); *G06F 16/583* (2019.01); *G06F 16/587* (2019.01); *G06F 30/20* (2020.01); *G06F 2219/10* (2013.01); *G06Q 10/04* (2013.01)

(56) References Cited

OTHER PUBLICATIONS

Hawcroft et al. (The contrasting climate response to tropical and extratropical energy perturbations. Clim Dyn 51, 3231-3249 (2018). https://doi.org/10.1007/s00382-018-4076-8) (Year: 2018).*

Monerie et al. (Role of atmospheric horizontal resolution in simulating tropical and subtropical South American precipitation in HadGEM3-GC31, Geosci. Model Dev., 13, 4749-4771, https://doi.org/10.5194/gmd-13-4749-2020, Oct. 2, 2020). (Year: 2020).*

Baron et al. (From GCM grid cell to agricultural plot: scale issues affecting modelling of climate impact. Philos Trans R Soc Lond B Biol Sci. Nov. 29, 2005;360(1463):2095-108. doi: 10.1098/rstb.2005.1741. PMID: 16433096; PMCID: PMC1569574) (Year: 2005).*

Office Action dated Jun. 29, 2022 in Korean Application No. 10-2020-0168235.

Hurtt et al., "Harmonization of global land use change and management for the period 850-2100 (LUH2) for CMIP6", Geosci. Model Dev., 13, 5425-5464, Nov. 10, 2020.

* cited by examiner

METHOD AND APPARATUS FOR PRODUCING GROUND VEGETATION INPUT DATA FOR GLOBAL CLIMATE CHANGE PREDICTION MODEL

CROSS-REFERENCE TO RELATED APPLICATION

This application is based on and claims priority under 35 U.S.C. § 119 to Korean Patent Application No. 10-2020-0168235, filed on Dec. 4, 2020, in the Korean Intellectual Property Office, the disclosure of which is incorporated by reference herein in its entirety.

BACKGROUND

1. Field

The present disclosure relates to production of ground vegetation input data for performing a global climate change prediction model. More specifically, the present disclosure relates to a process of generating forcing data from land-use harmonization (LUH) data provided by coupled model inter-comparison project (CMIP) of international climate research project.

2. Description of the Related Art

Ground vegetation forcing data that is used as input data input to a global climate change prediction model can be used for numerical calculations on ground vegetation within the prediction model. In the climate change prediction model used by the Korea Meteorological Administration, etc., multiple types of ground vegetation can be utilized, and different numerical calculation modules can be applied for each type of ground vegetation. Thus, it may be very important to correctly classify the types of ground vegetation and generate forcing data.

SUMMARY

The present disclosure provides a method of generating forcing data which has high compatibility with the types of ground vegetation used in the prediction model and reflects that the types of vegetation may be changed over time, in order to address issues generated due to universal data according to the prior art.

Additional aspects will be set forth in part in the description which follows and, in part, will be apparent from the description, or may be learned by practice of the presented embodiments of the disclosure.

According to an embodiment, an input data generating apparatus for generating forcing data used as input data for a climate change prediction model, includes: a memory storing instructions; and a processor configured to, by executing the instructions, collect new ground type data from land-use harmonization (LUH) data that is restored through history database of the global environment (HYDE) and provided by the coupled model inter-comparison project (CMIP), collect existing ground type data calculated by an existing model in a previous phase of the CMIP, generate aggregated ground type data by data-aggregating the new ground type data and the existing ground type data, with priority to the new ground type data, and generate the forcing data from the aggregated ground type data by performing a distortion correction on a data distortion that occurs during the data aggregation.

According to another embodiment of the present disclosure, a method of generating input data for generating forcing data used as input data for a climate change prediction model, the method being performed by a processor executing instructions stored in a memory, includes: collecting new ground type data from land-use harmonization (LUH) data that is restored through history database of the global environment (HYDE) and provided by the coupled model inter-comparison project (CMIP); collecting existing ground type data calculated by an existing model in a previous phase of the CMIP; generating aggregated ground type data by data-aggregating the new ground type data and the existing ground type data with priority to the new ground type data; and generating the forcing data from the aggregated ground type data by performing a distortion correction on a data distortion that occurs during the data aggregation.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
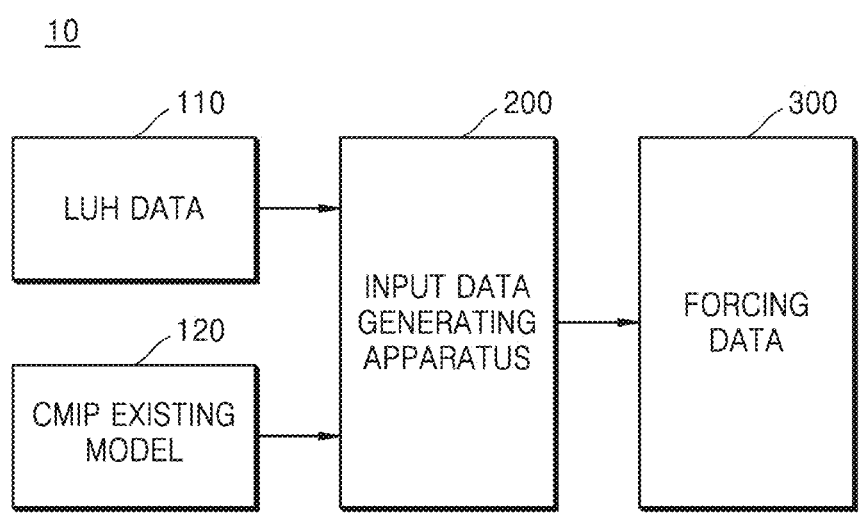
FIG. 1 is a diagram for describing a system for generating forcing data according to one or more embodiments.

The Korea Meteorological Administration or its related organizations use MODIS satellite data or IGBP ground type data in climate change prediction models or other numerical models. However, in the above data, because compatibility of categories for classifying the types of ground vegetation with respect to the climate change prediction model is low, subjective judgement of a user may be involved or types of ground vegetation that have changed over time may not be considered. That is, universal data according to the prior art may have categories that are not suitable for the climate change prediction model or may not reflect a temporal trend of climate simulation. In order to address the above issues, a technique for generating forcing data which has high compatibility with the types of ground vegetation used in the prediction model and reflects that the types of vegetation may be changed over time, as the input data to the climate change prediction model, may be required.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the drawings. The following description is only for specifying the embodiments, and is not intended to restrict or limit the scope of the present disclosure. What a person of ordinary skill in the art related to the present disclosure can easily infer from the detailed description and embodiments of the disclosure should be construed as belonging to the scope of the present disclosure.

Although the terms used in the present disclosure have been described as general terms widely used in the technical field related to the present disclosure, the terms may have different meanings according to an intention of one of ordinary skill in the art, the appearance of new technologies, examination standards, or precedent cases, etc. Some terms may be arbitrarily selected by the applicant, and in this case, the meaning of the arbitrarily selected terms will be described in detail. The terms used in the present disclosure should be interpreted as meanings reflecting the overall context of the specification, not just dictionary meanings.

The terms "consist(s) of" or "include(s) (or comprise(s))" should not be interpreted as including, without exception, all of the plurality of elements or the plurality of steps disclosed in the description. In other words, it should be understood that some of the elements or some of the steps may not be included, or that additional elements or steps may be further included.

In the present disclosure, expressions including ordinal numbers, such as "first" and "second," etc., may modify various elements. However, such elements are not limited by the above expressions. The expressions including an ordinal number should only be construed for the purpose of distinguishing one element or step from other elements or steps.

Hereinafter, embodiments of the present disclosure will be described in detail with reference to the drawings. Detailed descriptions of matters widely known to those of ordinary skill in the art related to the present disclosure will be omitted.

FIG. 1 is a diagram for describing a system for generating forcing data according to one or more embodiments.

Referring to FIG. 1, a system 10 for generating land-use harmonization (LUH) data 110, a coupled model inter-comparison project (CMIP) existing model 120, an input data generating apparatus 200, and the forcing data 300. In the system 10, the forcing data 300 may be generated from the LUH data 110 and the CMIP existing model 120 by the input data generating apparatus 200.

The LUH data 110 is data restored through a history database of the global environment (HYDE) and may be provided by CMIP. As described later, the LUH data 110 may be data only considering vegetation types of a C3 type and a C4 type, and a non-vegetation type of an urban type.

The LUH data 110 may only consider the C3 type, the C4 type, and the urban type in order to research influences of human activities in relation to agriculture and urbanization. According to the LUH data 110, changes in ground vegetation according to the human activities and time lapse may be considered, but only three kinds of types are reflected, and thus, it may be necessary to supplement the other types.

The CMIP existing model 120 may refer to a prediction model that participated in a previous phase of the CMIP corresponding to an international climate research project. For example, the CMIP existing model 120 may denote a prediction model in CMIP phase 5 that is finished most recently, or may denote phases after phase 5 according to progress of the project later.

According to the CMIP existing model 120, a plurality of types of ground vegetation constituting the forcing data 300 may all be provided. However, because the CMIP existing model 120 has already completed model formation, even when the types of ground vegetation have changed according to the human activities or the time lapse from the completion time to a present time point, the above changes may not be reflected.

The input data generating apparatus 200 may generate the forcing data 300 based on the LUH data 110 and the CMIP existing model 120. For three types, e.g., the C3 type, the C4 type, and urban type, the LUH data 110 is preferentially considered, and changes in the types of ground vegetation over time are reflected, and at the same time, types that may not be collected by the LUH data 110 may be collected by using the CMIP existing model 120. In addition, the input data generating apparatus 200 may correct distortions that may occur during the aggregation processes of the LUH data 110 and the CMIP existing model 120.

The forcing data 300 may be generated through the aggregation and distortion correction of the LUH data 110 and the CMIP existing model 120 by the input data generating apparatus 200. For some types, more accurate data may be reflected by the LUH data 110, and for compatibility with the climate change prediction model used in the Korea Meteorological Administration, etc., that is, to supplement the types of ground vegetation, the CMIP existing model 120 may be applied. Thus, the forcing data 300 having universal utilization and high reliability may be generated by the system 10.

Figure 2:
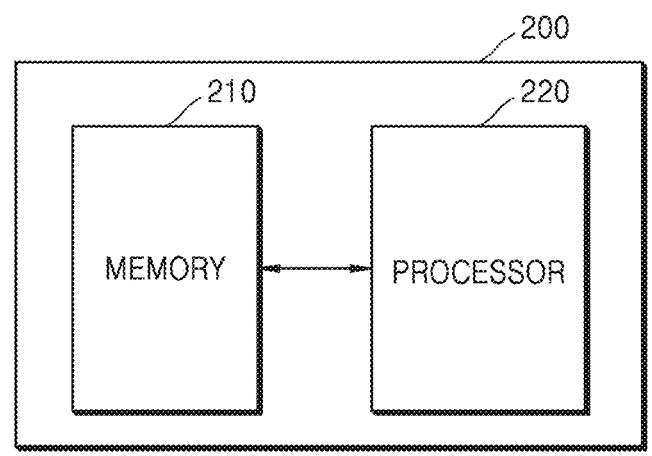
FIG. 2 is a block diagram showing elements included in an input data generating apparatus according to one or more embodiments.

FIG. 2 is a block diagram showing elements included in the input data generating apparatus according to one or more embodiments.

Referring to FIG. 2, the input data generating apparatus 200 for generating forcing data used as input data for a climate change prediction model may include a memory 210 and a processor 220. However, the present disclosure is not limited thereto, and universal elements other than the elements shown in FIG. 2 may be further included in the input data generating apparatus 200.

The input data generating apparatus 200 may be a computing device for generating the forcing data 300 based on the LUH data 110 and the CMIP existing model 120. Data input/output and data processing executed by the input data generating apparatus 200 may be implemented via mobile/web applications or a computer program. For example, the input data generating apparatus 200 may be implemented in the form of a PC, a smart phone, and a tablet PC. However, the present disclosure is not limited thereto, and the input data generating apparatus 200 may be implemented in the form of various electronic devices having processing performances.

The input data generating apparatus 200 may include the memory 210 as a unit for storing various data, instructions, and at least one program, or software, and may include the processor 220 as a unit for performing processes on various data by executing the instructions or at least one program.

The memory 210 may store various instructions for generating the forcing data 300. For example, the memory 210 may store instructions constituting a computer program or software such as a mobile/web application. In addition, the memory 210 may store various data required in the execution of an application or a program.

The memory 210 may be implemented as a non-volatile memory such as read only memory (ROM), programmable ROM (PROM), electrically programmable ROM (EPROM), electrically erasable and programmable ROM (EEPROM), flash memory, phase-change random access memory (PRAM), magnetic RAM (MRAM), resistive RAM (RRAM), ferroelectric RAM (FeRAM), etc., or a volatile memory such as dynamic RAM (DRAM), static RAM (SRAM), synchronous DRAM (SDRAM), phase-change RAM (PRAM), magnetic RAM (MRAM), resistive RAM (RRAM), ferroelectric RAM (FeRAM), etc. In addition, the memory 210 may be implemented as a hard disk drive (HDD), a solid-state drive (SSD), secure digital (SD), micro-SD, etc.

The processor 220 may perform a series of processes for generating the forcing data 300 by executing instructions stored in the memory 210. In addition, the processor 220 may perform overall functions for controlling the input data generating apparatus 200, and may process various operations in the input data generating apparatus 200.

The processor 220 may be implemented as an array of a plurality of logic gates or a universal microprocessor. The processor 220 may include a single processor or a plurality of processors. The processor 220 may be integrally configured with the memory 210, rather than as a separate element from the memory 210 for storing instructions. For example, the processor 220 may be implemented in the form of at least one of a central processing unit (CPU), a graphics processing unit (GPU), and an application processor (AP) provided in the input data generating apparatus 200.

The processor 220, by executing the instructions stored in the memory 210, may collect new ground type data from the LUH data 110 that is restored through a history database of the global environment (HYDE) and provided by the CMIP.

The new ground type data is collected through processes performed on the LUH data 110, for example, may be collected through the processes such as a grid transformation, grassland data aggregation such as pasture and natural, collection of non-vegetation data of an urban type, etc.

When collecting the new ground type data, the processor 220 performs a grid conversion on the LUH data 110 having a resolution of 0.25°×0.25° to collect the new ground type data having a resolution of 1.875°×1.25°. That is, a grid size may be converted for being converted to a format that is compatible with the climate change prediction model used in the Meteorological Administration, etc.

The processor 220 may collect existing ground type data calculated by an existing model in the previous phase of the CMIP by executing the instructions stored in the memory 210.

Materials on the types of ground vegetation in an old version may be obtained as the existing ground type data, by the existing model in the previous phase of the CMIP, that is, the CMIP existing model 120. For example, CMIP phase 5, etc. may be used as the CMIP existing model 120 in order to collect materials about remaining types except for the C3 type, the C4 type, and the urban type that are collected by the LUH data 110.

The processor 220, by executing instructions stored in the memory 210, performs the data-aggregation of the new ground type data and the existing ground type data while prioritizing the new ground type data, and thus, may generate aggregated ground type data.

Because the new ground type data collected by the LUH data 110 reflects the changes according to the human activities and the time lapse whereas the existing ground type data collected by the CMIP existing model 120 is the old version data, for parts conflicting with each other in the new ground type data and the existing ground type data, the new ground type data is reflected preferentially, and accordingly, the aggregated ground type data may be generated.

In addition, the forcing data 300 may be 9-kind grid arrangement data, in which one of 9 kinds of types including 5-kind vegetation types including broad leaf tree type, needle leaf tree type, the C3 type, the C4 type, and shrub type, and 4-kind of non-vegetation types including the urban type, inland-water type, bare-soil type, and ice type, is arranged in each grid. In addition, the new ground type data may include the vegetation types including the C3 type and the C4 type, and the non-vegetation type including the urban type.

As described above, the forcing data 300 may include 9-kind of types so as to be used as input data that is input to the climate change prediction model. In addition, the 9-kind of types included in the forcing data 300 may include 5-kind of vegetation types and 4-kind of non-vegetation types. Here, the new ground type data generated from the LUH data 110 may include 3 kinds including the C3 type, the C4 type, and the urban type.

With regard to the types of ground vegetation during the data-aggregation process, the processor 220 may perform the data-aggregation by utilizing the new ground type data with respect to the C3 type, the C4 type, and the urban type, and utilizing the existing ground type data with respect to remaining 6-kind of types when generating the aggregated ground type data.

As described above, in case of the C3 type, the C4 type, and the urban type, the new ground type data is up-to-date as compared with the existing ground type data, and thus, the new ground type data is reflected. In addition, with respect to remaining 6 kinds from among the 9-kind of types, that is, the broad leaf tree type, the needle leaf tree type, the shrub type, the inland-water type, the bare-soil type, and the ice type, the existing ground type data may be used.

On the other hand, with respect to the collection of the vegetation types of the new ground type data, that is, the C3 type and the C4 type, the processor 220, when collecting the new ground type data, may collect the C3 type and the C4 type data based on the grassland data of the pasture and the natural, from among detailed items in the LUH data 110.

That is, the LUH data 110 includes materials such as C3 pasture, C4 pasture, and C4 natural as the grassland data, and the C3 type and C4 type data may be collected from the LUH data 110 through discrimination, verification, and collection of the materials. In addition, in a similar way, the non-vegetation data of the urban type may be collected as the new ground type data from the materials included in the LUH data 110.

Meanwhile, regarding the format of the forcing data 300, the forcing data 300 may include an area ratio of each of the 9-kind of types, which is calculated based on grid areas of the 9-kind of types.

For example, the forcing data 300 may be grid data in which each grid point of a grid having a resolution of 1.875°×1.25° is allocated to any one of 9-kind of types. Here, the number of grid points allocated to each of 9-kind of types with respect to the entire grid points of the forcing data 300, that is, the total number of grid points formed on a target region of the forcing data 300 may be calculated as a value of 0 or 1, and the nine area ratios may be set to be 1 when they are added up.

The processor 220 may perform a distortion correction with respect to data distortions that occur during the data-aggregation process by executing the instructions stored in the memory 210, and may generate the forcing data 300 from the aggregated ground type data.

Because the new ground type data and the existing ground type data are collected from different objects, some distortion may occur in the aggregated ground type data when both are aggregated. For example, grid area ratios of some types may exceed set area ratio, and thus, accuracy may degrade.

Regarding the distortion correction performed on the aggregated ground type data in order to prevent the accuracy degradation, when the forcing data 300 is generated, in the case where an error occurs due to the data aggregation, the processor 220 may perform a distortion correction by adjusting the existing type data while preserving the new ground type data.

As described above, because the new ground type data corresponds to updated data whereas the existing ground type data is the old version data, when the new and existing ground type data conflict with each other, the new ground type data is reflected with priority and the existing ground type data may be adjusted. Accordingly, the changes in the vegetation type according to the time lapse and the human activities may be appropriately reflected to the forcing data 300.

In addition, regarding a specific method of correcting the distortion, when the distortion correction is performed, the processor 220 may adjust the grid area of the bare-soil type from the existing ground type data, and in particular, when the grid area of the C3 type and the grid area of the C4 type exceed the total grid area of the vegetation types, the grid area of the bare-soil type may be removed as much as the exceeding area range.

That is, when there is an error, such as exceeding the grid area ratio due to the C3 type, the C4 type, or the urban type data as a result of data aggregation, for example, when a sum of the grid area ratio of the C3 type and the grid area ratio of the C4 type exceeds the total area ratio of the vegetation type area, the distortion correction may be performed by subtracting the exceeding area from the bare-soil type.

Meanwhile, the distortion correction may be performed by reflecting a characteristic of the target position in the forcing data 300. For example, when the target position of the forcing data 300 is a polar region such as the South Pole, adjustment of the grid area ratio may be performed based on the ice type. Here, it may be preferable that a land portion in the polar region is adjusted as the ice type, and grid values of grids overlapping an ocean portion may be removed such that the grids overlapping the ocean portion may be classified as the ocean.

Figure 3:
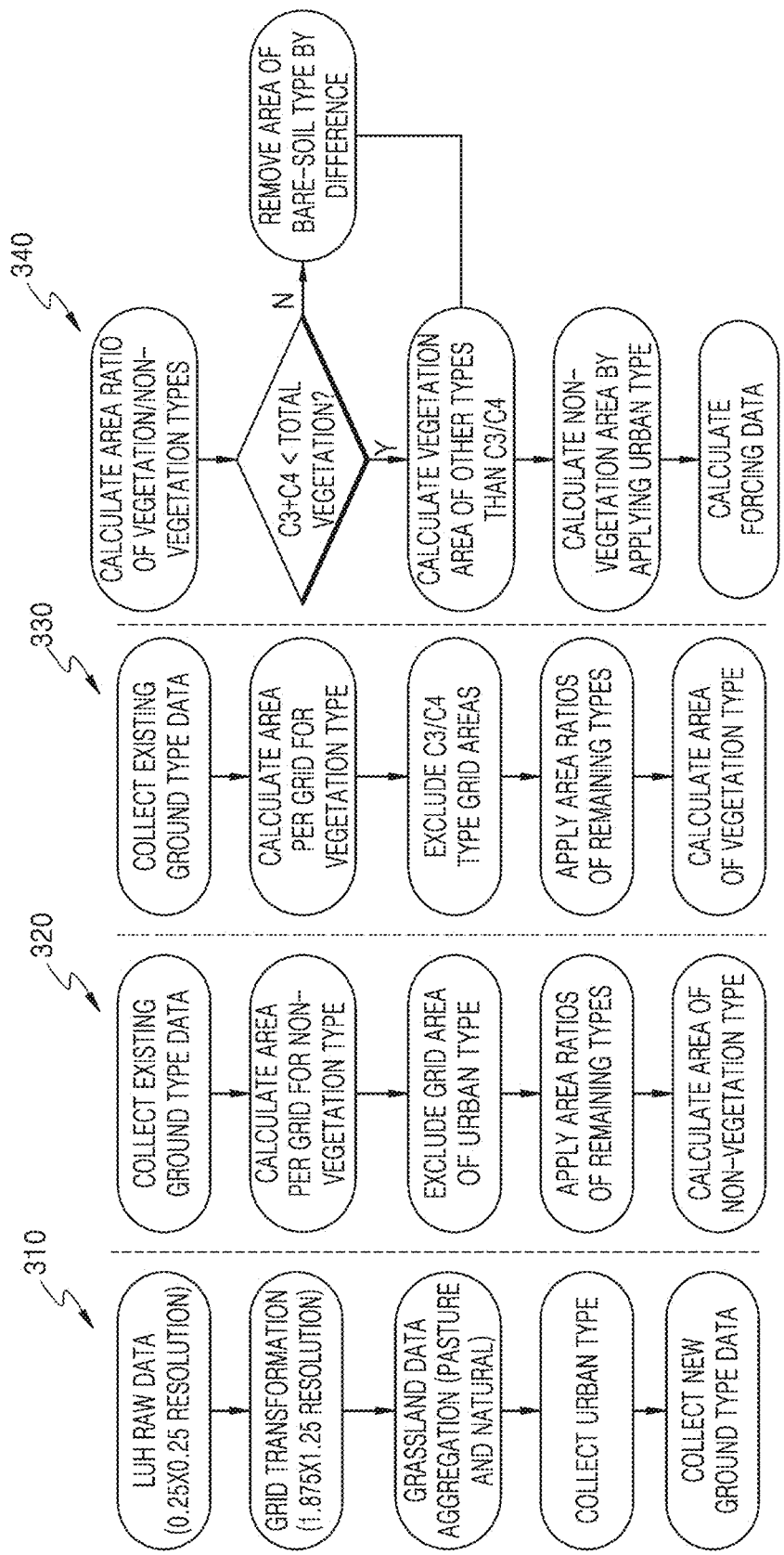
FIG. 3 is a diagram for describing processes of generating forcing data in detail, according to one or more embodiments.

FIG. 3 is a diagram for describing processes of generating forcing data in detail, according to some embodiments.

Referring to FIG. 3, a process 310 for collecting new ground type data, processes 320 and 330 for calculating a vegetation type area and a non-vegetation type area by data collection, and a process 340 for performing a distortion correction are shown.

In the process 310, new ground type data may be collected from raw data of the LUH data 110. During the above process, a grid transformation is performed on the raw data of the LUH data 110, the grid resolution may be changed to 1.875°×1.25° that is suitable for the climate change prediction model. After the grid transformation, the grassland data such as pasture, natural, etc. is aggregated and the data of the urban type is collected to collect the new ground type data including the C3 type, the C4 type, and the urban type.

In the process 320, after the existing ground type data is collected from the CMIP existing model 120, the non-vegetation type area may be calculated through the data-aggregation process. The area per grid of the 4-kind of non-vegetation types including the urban type, the inland-water type, the bare-soil type, and the ice type may be calculated based on the existing ground type data, and the urban type may be excluded in order to reflect the new ground type data.

In the process 330, after the existing ground type data is collected from the CMIP existing model 120, the vegetation type area may be calculated through the data-aggregation process. From the existing ground type data, the area per grid for the 5-kind of vegetation types including the broad leaf tree type, the needle leaf tree type, the C3 type, the C4 type, and the shrub type may be calculated, and the C3 type and the C4 type may be excluded for reflecting the new ground type data.

In the process 340, the distortion correction is performed on the aggregated ground type data to calculate the forcing data 300. The distortion correction may be performed based on the area ratios of the vegetation type and the non-vegetation type. For example, when the sum of the area ratio of the C3 type and the area ratio of the C4 type is greater than the total area ratio of the vegetation types and thus, an error (N) occurs, the C3 type and the C4 type are preserved in order to reflect the new data of the LUH data 110, and instead, the difference may be removed from the bare-soil type. Similar processes to the above processes may be performed with respect to the urban type, and the forcing data 300 may be generated as a final result.

Figure 4:
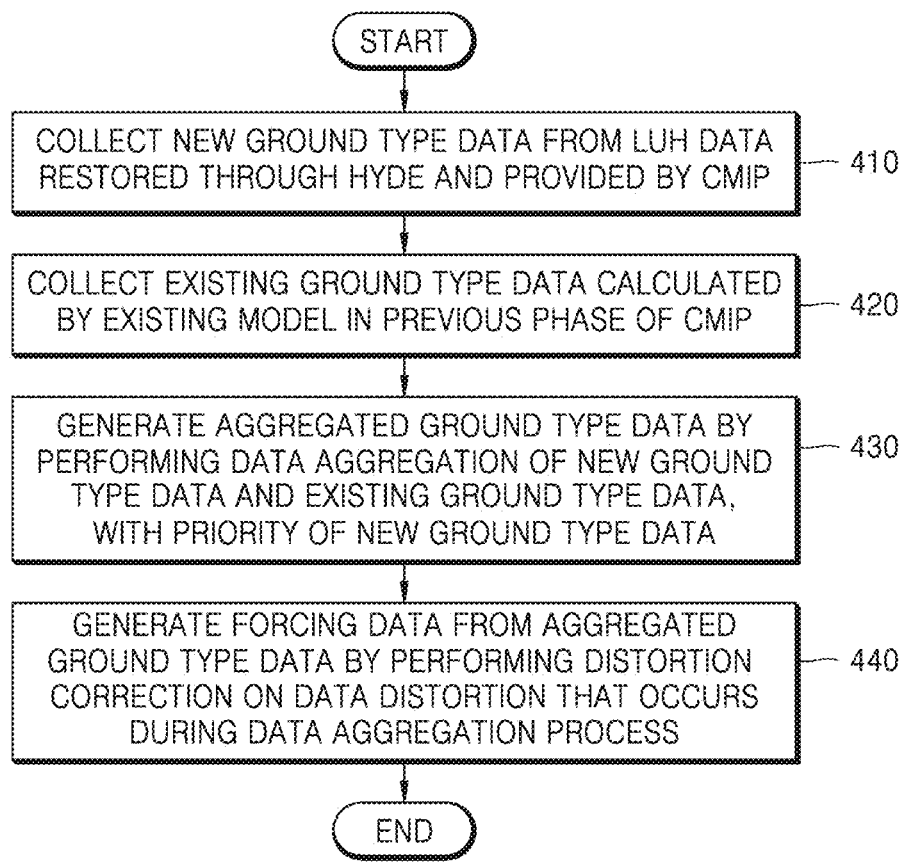
FIG. 4 is a flowchart illustrating steps included in a method of generating input data according to one or more embodiments.

FIG. 4 is a flowchart illustrating steps included in a method of generating input data according to some embodiments.

Referring to FIG. 4, the method of generating input data may include operations 410 to 440. However, the present disclosure is not limited thereto, and universal steps other than the operations shown in FIG. 4 may be further included in the method of generating input data.

The method of generating input data of FIG. 4 may include operations performed in time serial manner in the input data generating apparatus 200 described above with reference to FIG. 1 to FIG. 3. Accordingly, even though omitted below, the above descriptions about the input data generating apparatus 200 may be equally applied to the method of generating the input data.

In operation 410, the input data generating apparatus 200 may collect the new ground type data from the LUH data 110 that is restored through the HYDE and provided by the CMIP.

When collecting the new ground type data, the input data generating apparatus 200 may collect the new ground type data having a resolution of 1.875°×1.25° by performing a grid transformation on the LUH data 110 having a resolution of 0.25°×0.25°.

When collecting the ground type data, the input data generating apparatus 200 may collect the C3 type and C4 type data based on the grassland data including pasture and natural from among the detailed items of the LUH data 110.

In operation 420, the input data generating apparatus 200 may collect the existing ground type data calculated by the CMIP existing model 120 in the previous phase of the CMIP.

The forcing data 300 may be 9-kind grid arrangement data, in which one of 9-kind of types including 5-kind vegetation types including broad leaf tree type, needle leaf tree type, the C3 type, the C4 type, and shrub type, and 4-kind of non-vegetation types including the urban type, inland-water type, bare-soil type, and ice type, is arranged in each grid. In addition, the new ground type data may include the vegetation types including the C3 type and the C4 type, and the non-vegetation type including the urban type.

In operation 430, the input data generating apparatus 200 may perform the data-aggregation of the new ground type data and the existing ground type data while prioritizing the new ground type data, and thus, may generate aggregated ground type data.

When generating the aggregated ground type data, the input data generating apparatus 200 may perform the data-aggregation by utilizing the new ground type data for the C3 type, the C4 type, and the urban type, and utilizing the existing ground type data for the remaining 6-kind of types.

The forcing data 300 may include an area ratio of each of the 9-kind of types calculated based on the grid areas of the 9-kind of types.

In operation 440, the input data generating apparatus 200 may perform a distortion correction with respect to data distortions that occur during the data-aggregation process, and may generate the forcing data 300 from the aggregated ground type data.

When generating the forcing data 300, in the case where an error occurs due to the data aggregation, the input data generating apparatus 200 may perform a distortion correction by adjusting the existing ground type data while preserving the new ground type data.

For example, the format of the forcing data 300 may be a NetCDF file, a PP file, or an FF file, but is not limited thereto.

When the grid areas of the C3 type and the C4 type exceed the total grid area of the vegetation types, the input data generating apparatus 200, in performing the distortion correction, may remove the grid area of the bare-soil type as much as the exceeding area range.

The method of generating input data of FIG. 4 may be recorded in a computer-readable recording medium having embodied thereon at least one program or software including instructions for executing the method.

Examples of computer-readable media include magnetic media such as hard disks, floppy disks, and magnetic tape; optical media such as CD ROM disks and DVD; magneto-optical media such as floptical disks; and hardware devices that are specially to store and perform program commands, such as ROM, RAM, flash memory, etc. Examples of the program commands may include not only machine language codes but also high-level language codes which are executable by various computing means by using an interpreter.

While the embodiments of the present disclosure have been described in detail, it is to be understood that the disclosure is not limited to the disclosed embodiments of the disclosure, but, on the contrary, is intended to cover various modifications and equivalent arrangements of those who skilled in the art included within the spirit and scope of the appended claims.

According to the apparatus and method of generating input data of the present disclosure, the forcing data including the types of ground vegetation used in the climate change prediction model may be generated, and thus, the input data that has high reliability and may be utilized in various fields such as a global scale numerical model operating in the Korea Meteorological Administration, etc. may be provided.

In addition, during the processes of generating the forcing data, the new ground type data collected from the LUH data may be aggregated prior to the existing ground type data from the CMIP existing model, and thus, even when there are changes in the types of ground vegetation according to the time laps, the changes may be appropriately reflected to the forcing data. Thus, accuracy and reliability of the forcing data may be further improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. An input data generating apparatus for generating forcing data used as input data for a climate change prediction model, the input data generating apparatus comprising:
a memory storing instructions; and
a processor configured to, by executing the instructions;
communicate data with a coupled model inter-comparison project (CMIP) model database storing a CMIP model;
retrieve existing ground type data from the CMIP model stored in the CMIP model database, wherein:
the existing ground type data has been generated at a first point in time,
the existing ground type data comprises vegetation types of data and non-vegetation types of data each arranged in grid,
the vegetation types of data including one or more of a broad leaf tree type, a needle leaf tree type, a C3 type, a C4 type, or a shrub type, and
the non-vegetation types of data including one or more of an urban type, an inland-water type, a bare-soil type, and an ice type, is arranged in each grid;
communicate data with a land-use harmonization (LUH) data database, wherein the LUH data database stores LUH data having a first grid size;
determine that the first gird size of the LUH data is not compatible with a predetermined climate change prediction model;
generate new ground type data from the LUH data stored in the LUH data database by converting the first grid size into a second grid size that is compatible with the predetermined climate change prediction model, such that the new ground type data has the second grid size, wherein:
the new ground type data comprises the C3 type and the C4 type selected from the vegetation types and the urban type selected from the non-vegetation types, and
the new ground type data reflects changes in ground vegetation according to human activities and time lapse at least between the first point in time and a second point in time later than the first point in time;
generate aggregated ground type data by data-aggregating the new ground type data and the existing ground type data such that:
the C3 type and the C4 type of the new ground type data are selected without selecting the C3 type and the C4 type from the vegetation types of data of the existing ground type data,
the urban type of the new ground type data is selected without selecting the urban type from the non-vegetation types of data of the existing ground type data,
the C3 type and the C4 type of the new ground type data are combined with one or more of the broad leaf tree type, the needle leaf tree type, or the shrub type selected from the vegetation types of data of the existing ground type data to generate aggregated vegetation types of data, and the urban type of the new ground type data is combined with one or more of the inland-water type, the bare-soil type, or the ice type selected from the non-vegetation types of data of the existing ground type data to generate aggregated non-vegetation types of data, determine whether the new ground type data and the existing ground type data conflict each other in one or more of the aggregated vegetation types of data or the aggregated non-vegetation types of data;

in response to determining that the new ground type data and the existing ground type data conflict each other, adjust one or more types of the existing ground type data, without adjusting the new ground type data, to generate the forcing data; and apply the generated forcing data as an input to the climate prediction model.

2. The input data generating apparatus of claim 1, wherein, when the new ground type data is collected, the processor is configured to collect the new ground type data having a resolution of 1.875°×1.25° by performing a grid conversion on the LUH data having a resolution of 0.25°× 1.25°.

3. The input data generating apparatus of claim 1, wherein, when the new ground type data is collected, the processor is configured to collect the C3 type and C4 type data based on grassland data including pasture and natural from among detailed items of the LUH data.

4. The input data generating apparatus of claim 1, wherein the forcing data includes an area ratio of each of the aggregated vegetation and non-vegetation types of data calculated based on grid areas of the aggregated vegetation and non-vegetation types of data.

5. The input data generating apparatus of claim 1, wherein, in adjusting the one or more types of the existing ground type data to generate the forcing data, the processor is configured to:

determine whether a sum of a grid area of the C3 type and a grid area of the C4 type exceeds a total grid area of the aggregated vegetation types of data; and in response to determining that the sum exceeds the total grid area of the aggregated vegetation types of data, subtract an exceeding area from a grid area of the bare-soil type of the aggregated non-vegetation types of the existing ground type data.

6. A method of generating input data for generating forcing data used as input data for a climate change prediction model, the method being performed by a processor executing instructions stored in a memory, the method comprising:

communicating data with a coupled model inter-comparison project (CMIP) model database storing a CMIP model;

retrieving existing ground type data from the CMIP model stored in the CMIP model database, wherein:

the existing ground type data has been generated at a first point in time, the existing ground type data comprises vegetation types of data and non-vegetation types of data each arranged in grid, the vegetation types of data including one or more of a broad leaf tree type, a needle leaf tree type, a C3 type, a C4 type, or a shrub type, and the non-vegetation types of data including one or more of an urban type, an inland-water type, a bare-soil type, and an ice type, is arranged in each grid;

communicating data with a land-use harmonization (LUH) data database, wherein the LUH data database stores LUH data having a first grid size;

determining that the first gird size of the LUH data is not compatible with a predetermined climate change prediction model;

generating new ground type data from the LUH data stored in the LUH data database by converting the first grid size into a second grid size that is compatible with the predetermined climate change prediction model, such that the new ground type data has the second grid size, wherein:

the new ground type data comprises the C3 type and the C4 type selected from the vegetation types and the urban type selected from the non-vegetation types, and the new ground type data reflects changes in ground vegetation according to human activities and time lapse at least between the first point in time and a second point in time later than the first point in time;

generating aggregated ground type data by data-aggregating the new ground type data and the existing ground type data such that:

the C3 type and the C4 type of the new ground type data are selected without selecting the C3 type and the C4 type from the vegetation types of data of the existing ground type data, the urban type of the new ground type data is selected without selecting the urban type from the non-vegetation types of data of the existing ground type data, the C3 type and the C4 type of the new ground type data are combined with one or more of the broad leaf tree type, the needle leaf tree type, or the shrub type selected from the vegetation types of data of the existing ground type data to generate aggregated vegetation types of data, and the urban type of the new ground type data is combined with one or more of the inland-water type, the bare-soil type, or the ice type selected from the non-vegetation types of data of the existing ground type data to generate aggregated non-vegetation types of data;

determining whether the new ground type data and the existing ground type data conflict each other in one or more of the aggregated vegetation types of data or the aggregated non-vegetation types of data;

in response to determining that the new ground type data and the existing ground type data conflict each other, adjusting one or more types of the existing ground type data, without adjusting the new ground type data, to generate the forcing data; and applying the generated forcing data as an input to the climate prediction model.

* * * * *